METHOD OF FABRICATING A SEMICONDUCTOR DEVICE

Filed April 1, 1971 7 Sheets-Sheet 1

INVENTORS
Dean R. Collins
William R. McMahon

METHOD OF FABRICATING A SEMICONDUCTOR DEVICE

Filed April 1, 1971 7 Sheets-Sheet 3

3,756,924

METHOD OF FABRICATING A SEMICONDUCTOR DEVICE

Dean Robert Collins, Dallas, and William Raymond McMahon, Richardson, Tex., assignors to Texas Instruments Incorporated, Dallas, Tex.

Filed Apr. 1, 1971, Ser. No. 130,358
Int. Cl. C23b *5/48, 9/02, 11/02*
U.S. Cl. 204—15 11 Claims

ABSTRACT OF THE DISCLOSURE

Disclosed is a method for forming a structure having adjacent closely spaced electrodes coplanar with the surface of a substrate and electrically insulated therefrom. A first layer of metal is deposited to overlie a passivated surface of a semiconductor substrate. The layer of metal is patterned to define a set of electrodes and a bus bar is formed to connect the various electrodes to a voltage source. The exposed surface layer of each electrode is anodized to form an insulating layer thereover. The bus bar is subsequently removed. A second layer of metal is formed over the first set of electrodes and the exposed surface of the substrate between adjacent electrodes. The second layer of metal is patterned to define a second set of electrodes which are separated from the first set of electrodes by only the thickness of the anodized oxide layer. In one aspect of the invention, the method is utilized to fabricate a charge coupled device.

This invention relates to metallization techniques in general and, more particularly, to the method for fabricating extremely closely spaced coplanar metal electrodes to overlie a semiconductor substrate. As used herein, "coplanar" refers to a structure wherein the interface between the semiconductor material and a surface of various electrode or metal regions formed thereon all lie in the same plane, even though the top surface of respective regions of metal may be in different planes, e.g., as in a multilevel metallization structure.

There are many applications in the art wherein extremely close spacing between adjacent regions of metal is required. Photolithographical metallization techniques are conventionally utilized to form these closely spaced regions of metal or electrodes, but these techniques are tedious and difficult to work with when small dimensions are required. By way of example, interdigitated transducers for surface wave devices, emitter base metallization on bipolar devices, and charge coupled devices are exemplary of some of the applications requiring closely spaced electrodes. With regard to the latter, such devices are metal-insulator-semiconductor devices which store and transfer information in the form of electrical charge and require extremely closely spaced electrodes to operate effectively. Charge coupled devices are distinguished by the property that the semiconductor portion of the device is, for the most part, homogeneously doped; impurity diffusions are required only for injecting or extracting charge. In general, three or more sets of metal electrodes are deposited on an insulator-semiconductor structure. The electrodes are interconnected so that different voltages may sequentially be applied to adjacent electrodes. Charge is injected into the region of the semiconductor under the first electrode, and "clocking pulses" are sequentially applied to the electrodes. As a result of the inversion of the semiconductor surface, minority carriers are drawn to the semiconductor-insulator interface and tend to collect in "potential wells" under the metal electrodes. If the clocking pulses are sufficiently large, the minority carrier will migrate from the area under one electrode to the area under the adjacent electrode following the potential wells produced by the clocking pulses. In this manner the location of the electrical charges may be controlled. One type of charge coupled device is described in Boyle et al., Bell System Tech J. 49,587 (1970). Two level metallization techniques for fabricating charge coupled devices are discussed in Engeler et al. Applied Physics Letters 17, page 469, 1970 and "Strain, Power and Surface-State Loss Analysis of Charge-Coupled Devices," page 78, Abstracts of the 1970 International Electron Device Meeting, October 28–30, Washington, D.C. (IEEE 70–C45–ED).

Since charge coupled devices are in essence "junctionless," i.e., p-n junctions are not required for basic operation of the device, there is an almost total absence of diffusions, which offers significant fabrication advantages. A major problem associated with charge coupled devices to date, however, is maintaining a sufficiently close spacing between adjacent electrodes to prevent potential barriers between electrodes that impede transfer of charge.

Accordingly, an object of the present invention is to provide a structure wherein the separation between adjacent electrodes is determined by the thickness of an anodized oxide layer.

A further object of the present invention is to provide a charge coupled device utilizing a multilevel metallization system where all of the metallization is of the same resistivity.

Still another object of the present invention is to provide a multilevel system for producing a charge coupled device wherein the separation between the electrodes and the substrate is uniform from electrode to electrode.

An additional object of the invention is to form a structure wherein use of the surface area of the semiconductor material may be increased.

Briefly, and in accordance with the present invention, there are disclosed methods for forming adjacent closely spaced electrodes coplanar with an insulating surface of a substrate. In one aspect of the invention, the methods are utilized to fabricate a charge coupled device. A first layer of metal is formed to overlie an insulating surface of the substrate and this layer is patterned to define the first layer of metal electrodes. Means are provided for electrically interconnecting each of the electrodes and connecting the electrodes to a voltage source so that anodization may be effected. A thin layer of oxide is formed over the surface of each of the electrodes and the interconnection means are removed. A second layer of the same or different metal is then deposited to overlie the anodized surface of each of the electrodes and the exposed insulating surface of the substrate between the various electrodes. The second layer of metal is then patterned to form a second set of electrodes, one surface of which is coplanar with the surface of the first set of electrodes that contacts the insulating surface. First and second sets of electrodes are respectively separated only by the thickness of the anodized oxide layer. During fabrication, via holes are provided for contact to the substrate surface and first level electrodes.

In one embodiment of the invention, a charge coupled memory is disclosed. In this embodiment, an insulating layer is formed to overlie a surface of a semiconductor substrate. A first set of metal electrodes are defined to overlie the insulating surface. A thin barrier oxide layer is then formed to overlie the exposed surface of the first set of electrodes and a second set of electrodes interleaved and coplanar with the first set of electrodes is formed to overlie the insulating surface. Means are provided for entering electrical charges into the semiconductor substrate and for sequentially applying signals to the first and second sets of electrodes to control the position of the electrical charges entered. Means are also provided for detecting the presence of electrical charge to effect memory operations.

In a different embodiment of the invention, an interdigitated surface wave transducer is disclosed. Adjacent electrodes are spaced extremely close, enabling high frequency operation.

For clarity of description, the invention will now be described as it pertains to a charge coupled device and method of fabrication. It is to be understood, of course, that such description is by way of example only, and that the present invention may be utilized in any application wherein closely spaced regions of metal are desired.

Figure 1:
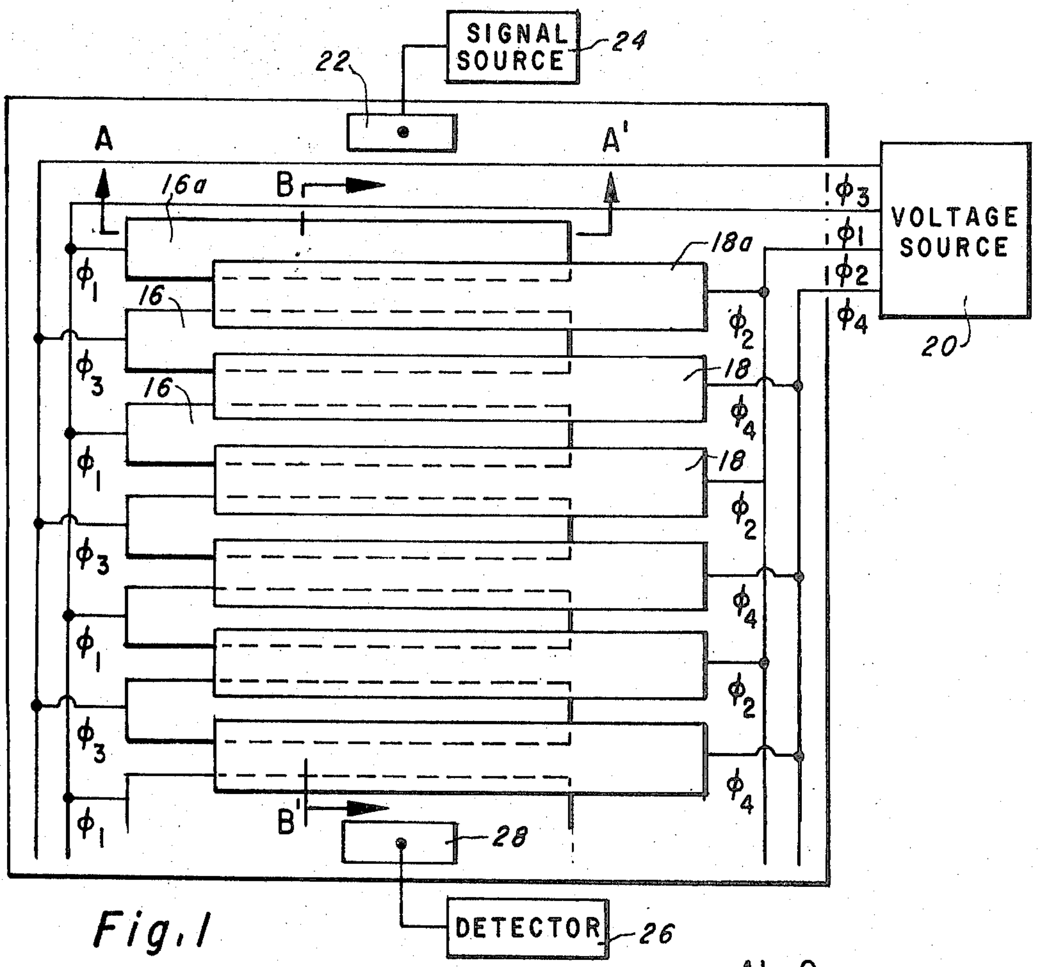
FIG. 1 is a plan view of a portion of a charge coupled device utilizing the two level metallization technique in accordance with the present invention.
Figure 2:
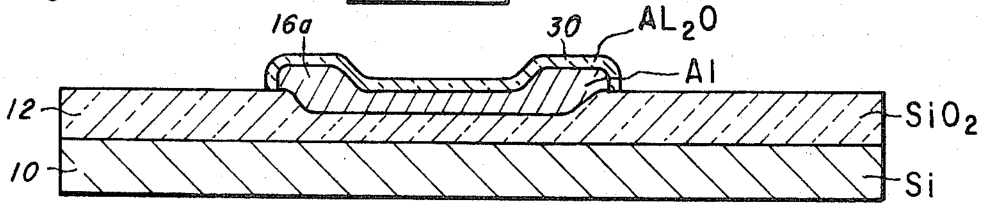
FIG. 2 is a sectional view of a portion of the device shown in FIG. 1 along lines A–A′.
Figure 3:
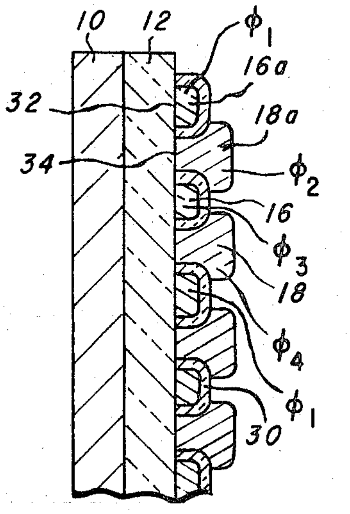
FIG. 3 is a sectional view of a portion of the device shown in FIG. 1 along lines B–B′.
Figure 5:
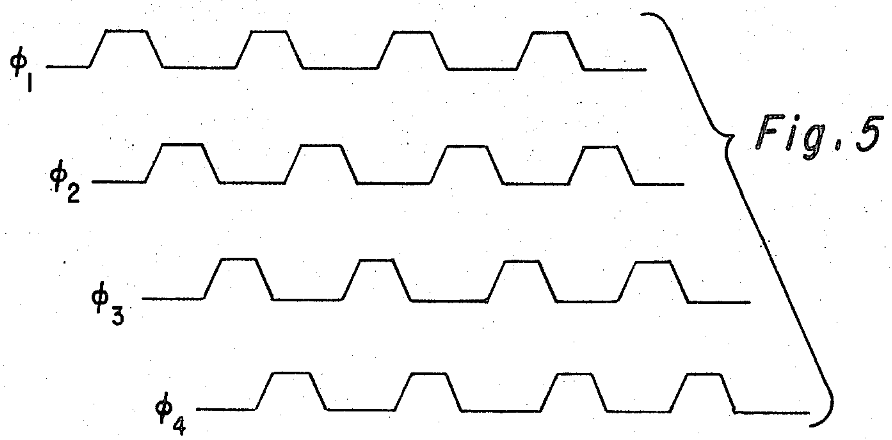
FIG. 5 depicts representative clock pulses that may be used for a four phase charge coupled memory in accordance with an embodiment of the present invention.

With reference to FIGS. 1, 2, and 3, there is depicted an illustrative embodiment of the present invention as it is utilized to form a four phase charge coupled device. FIG. 1 pictorially and schematically depicts a plan view of a charge coupled device. A semiconductor substrate is shown generally at 10. This substrate may, for example, comprise n-type silicon, but other semiconductor materials, both p- and n-type, well-known to those skilled in the art may be utilized, if desired. An insulating layer 12 is formed to overlie the semiconductor substrate 10. This layer may be seen most clearly with reference to FIG. 2 and may, for example, comprise silicon oxide formed to a thickness in the range of 12,000 A°. A portion of the insulating layer 12, shown generally in the region 14, is formed in a relatively thin, uniform layer of, e.g., 1,000 A°. Methods for forming insulating layers to desired thicknesses on semiconductor substrates are known to those skilled in the art and need not be described in detail herein. Metal electrodes, shown generally at 16 and 18, are formed to overlie the insulating layer 12 and, more particularly, the relatively thin layer 14. As will be explained in more detail hereinafter, the metal electrodes 16 are formed in a first metallization layer while the metal electrodes 18 are formed in a second metallization layer. Electrical contacts are made to sequential electrodes and clock pulses shown in FIG. 1 as $\phi_1$, $\phi_2$, $\phi_3$ and $\phi_4$ are respectively applied to the electrodes 16 and 18. As may be seen, a set of four adjacent electrodes defines a repeating unit for the four phase charge coupled device shown in FIG. 1. A voltage source 20 provides pulses for the clock pulses $\phi_1$–$\phi_4$. Representative clock pulses that may be utilized in accordance with the present invention are depicted in FIG. 5.

As may be seen therein, for the situation wherein four clock pulses are utilized, each successive clock pulse is displaced by 90° from the preceding clock pulse. As will be understood by those skilled in the art, sequential clock pulses applied to the device as depicted in FIG. 1, are effective to control the position of charges inserted into semiconductor material 10. Means for inserting electrical charge into the semiconductor material 10 are depicted generally at 22 and 24. The signal source 24 provides a signal to the substrate 10 through an aperture 22. Different techniques for inserting a charge to the semiconductor material 10 are known to those skilled in the art. For example, a p-n junction may be formed in the region 22 to effect insertion of a signal. Also, a modulated light source may be utilized to create hole-electron pairs in the substrate 10 to effect charge insertion. Means for detecting the presence of a charge in the substrate 10 are shown generally at 26. Detection means are also well known to those skilled in the art and may, for example, comprise a p-n junction making contact with the semiconductor material 10 through an aperture 28. Also, a Schottky barrier may be utilized to detect the presence of a charge.

With reference now specifically to FIG. 2, there is depicted a sectional view along lines A–A′ of FIG. 1. As may be seen, the electrode **16*a* is formed to overlie the relatively thin region 14 of the insulating layer 12. A relatively thin insulating layer 30 is formed to overlie the electrodes 16. The manner in which the insulating layer 30** is formed and the function thereof will be described in more detail hereinafter.

With reference now specifically to FIG. 3, there is depicted a sectional view of a portion of the line along B–B′ in region 14. As may be seen, the first level metallization electrode **16*a* is separated from the second level metallization electrode 18*a* only by the thickness of the insulating layer 30. In view of the fact that the insulating layer 30 may be formed in accordance with the present invention to have a thickness in the range of 3000 angstroms or less, it may be seen that the adjacent electrodes 16 and 18 are advantageously formed extremely close together, having coplanar contact regions 32 and 34, respectively, with the insulating layer 12. Stated in other words, adjacent electrodes 16 and 18 have contact regions uniformly spaced from the surface of the semiconductor material 10**. As will be understood by those skilled in the art, such a structure is extremely advantageous in a charge coupled device since clocking pulses applied to adjacent electrodes may be of the same amplitude.

In accordance with the present invention, the electrodes 16 and 18 are preferably formed of material having the same resistivity. In a preferred embodiment, the electrodes 16 and 18 are formed of aluminum and the insulating layer 30 is aluminum oxide formed by anodizing a portion of each electrode 16. Other anodizable metals could be used such as, for example, titanium, tantalum, etc. The method by which the electrodes 16 are anodized will be discussed in more detail with reference to FIGS. 6–10 herein.

An additional advantage is also produced in that utilization of the available surface area of the semiconductor material 10 is substantially increased as compared to single level metallization structures conventionally utilized. Stated in another way, it is desirable to have a large area of active material, i.e., metal regions, as compared with inactive or insulating regions. In accordance with the present invention, the inactive region is decreased. In fact, the insulating anodized aluminum layer may be formed to a thickness of 3000 angstroms or less. Having thus decreased the inactive area, the width of the metal electrodes, such as 16 and 18, may correspondingly be decreased to a width on the order of 0.2 mil while maintaining an advantageous ratio of metal to insulator. This not only reduces the area required to handle a bit of data but also increases the speed of operation of charge coupled devices since the charge carrier transfer time from electrode to electrode is reduced. Thus, when compared to a conventional device, the three phase two level metallization device, in accordance with the present invention, effects a reduction of approximately 40% in surface area of semiconductor material, per bit of data. Similarly, a four phase two level metallization charge coupled device, in accordance with the present invention, effects a savings of approximately 20% surface area per bit as compared to a three phase single level metallization charge coupled device.

Figure 4:
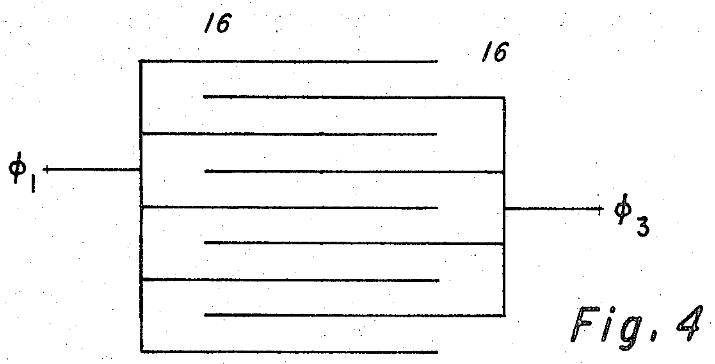
FIG. 4 is a schematic representation of the first level electrode pattern shown in FIG. 1.

With reference to FIG. 4, there is schematically illustrated the electrical interconnection of the first level metallization electrodes 16 for a four phase charge coupled device. As may be seen, every other first level metallization electrode 16 is electrically interconnected and a clock pulse $\phi_1$ applied thereto. Similarly, the remaining first level metallization electrodes 16 are electrically interconnected and a clock pulse $\phi_3$ applied thereto. These electrical interconnections may be made either as shown or by utilizing vertical interconnection techniques through apertures or via holes, such as illustrated in FIG. 6–10. Also, it is to be understood that the via holes, through the $Al_3O_2$, could be etched utilizing well known etches and techniques rather than utilizing masking techniques illustrated in FIGS 6–10. With reference again to FIG. 4, it may be seen that in fabricating the device shown in FIG. 1, the schematic pattern of the second level metallization electrodes 18 will be similar to that shown in FIG. 4, except that the connection shown as $\phi_1$ will be replaced by the clock pulse $\phi_2$ and that shown as $\phi_3$ will be replaced by the clock pulse $\phi_4$. It is understood, of course, that some technique is required for insulating the first level electrodes 16 from the subsequently formed electrodes 18.

In accordance with the present invention, the first level metal electrodes 16 are insulated from the second level metallization electrodes 18 by an insulating layer formed to overlie the set of electrodes 16. This insulating layer is formed by anodizing the surface portion of each electrode 16 to form an oxide layer which is insulating. In this respect, however, it is to be noted that the electrodes 16 are formed to overlie an insulating layer and thus are electrically isolated from the semiconductor substrate 10. Thus, anodizing current may not be applied through the semiconductor material 10. Further, after the first level metal has been applied and masking and etching techniques effected to pattern the individual electrodes 16, the electrodes of the different phases are electrically insulated from each other. That is, there is no interconnection between the two sets of first level metal electrodes. In accordance with the present invention, a method is provided for electrically interconnecting the electrodes with the substrate so that anodization may be effected and then for removing the electrical interconnection so that subsequent processing steps may be effected.

Figure 6:
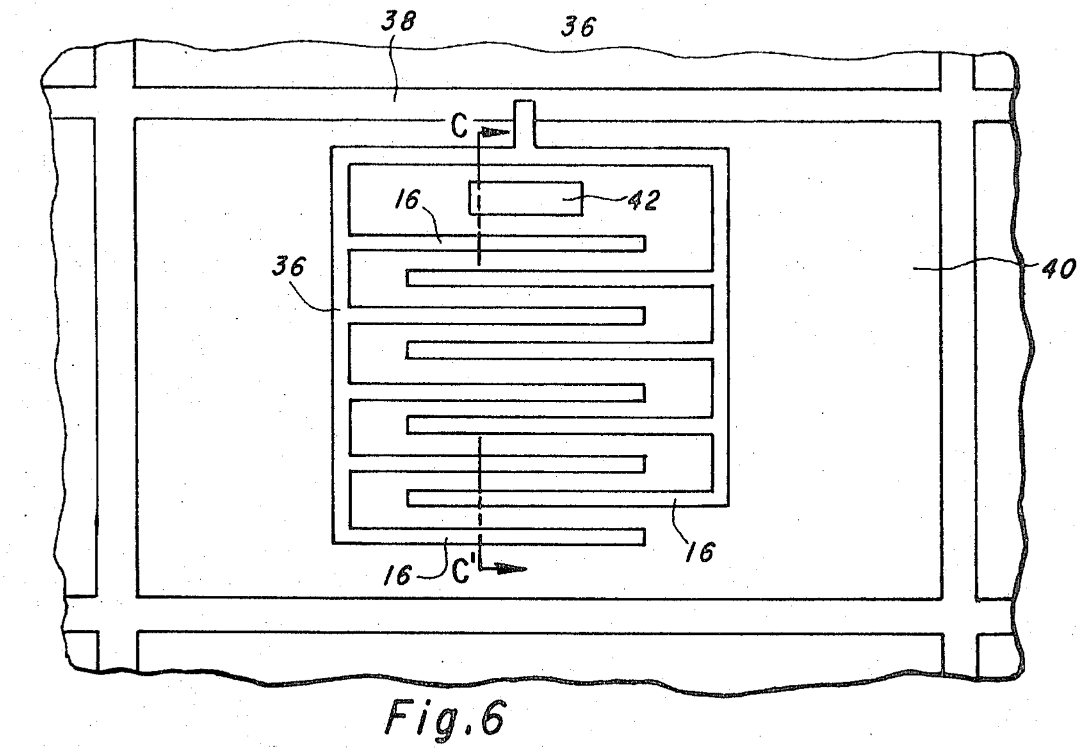
FIG. 6 is a plan view pictorially illustrating one arrangement that may be utilized to provide anodizing current to the first level metallization electrodes.

With reference to FIG. 6, there is pictorially illustrated one technique in accordance with the present invention for providing a path of electrical current to the metal electrodes 16 so that anodization may be accomplished. For convenience of description of the present invention, the processing steps will be described relative to utilizing aluminum electrodes and anodizing a portion of the aluminum to form aluminum oxide. Techniques for anodizing aluminum to form insulating layers are described in more detail in a copending application of William McMahon, Ser. No. 843,642 entitled, "Thin Film Metallization Process for Microcircuits," dated July 22, 1969, and assigned to the same assignee as the present invention, now U.S. Pat. No. 3,634,204. This application describes wet anodization techniques but it is to be understood that other methods such as plasma anodization or chemical conversion coatings which provide insulating coatings may be used.

To effect anodization of the aluminum electrodes, a potential must be applied to the aluminum which, as explained in the aforementioned copending application, is to be immersed in a solution to effect anodization. In accordance with the present invention, a potential of, for example, 120 volts, may be desirable. As shown in FIG. 6, the bus bar 36 may be formed to interconnect the electrodes 16. Preferably, the bus bar 36 is routed to terminate in a scribe line 38 so that electrical contact may be made to the back of the wafer 40 of semiconductor material. A potential may then be applied to the bus bar in the region of the scribe line 38 without damaging the semiconductor material of the wafer 40. After anodization is completed to the desired thickness, various techniques for removing the bus bar 36 so that subsequent metallization steps may be effected are described in more detail with reference to FIGS. 7–10. By way of illustration, a region 42 contacting the surface of the semiconductor material of the wafer 40 is shown in FIG. 6. Such a region may be utilized, for example, for entering charge into the semiconductor material or for detecting the presence of a charge. It is pointed out that the configuration of the bus bar 36 is in no way critical and the pattern by which it is routed to the scribe line 38 may be chosen for design convenience.

With reference now to FIGS. 7*a*–7*e*, there is depicted cross-sectional views along the lines C–C′ of FIG. 6 illustrating various steps of the method of constructing adjacent closely spaced electrodes separated only by an anodized oxide layer. A n-type silicon substrate is indicated at 44. A p-type silicon substrate could also be used. A silicon oxide layer 46 is formed to overlie the surface of the substrate 44 and a contact through the layer 46 to the silicon material 44 is shown generally at 48. As explained previously, this contact may be utilized, for example, for entering charge into the silicon substrate 44 or for detecting the presence of charge. Thus, for entering a charge, a p-n junction may be formed in the region 48. When regions such as that shown in 48 are desired to be utilized for detection purposes, a Schottky barrier may be formed therein or a p-n junction may be utilized. Techniques for entering charge into the semiconductor substrate and for detecting the presence of a charge therein are well-known to those skilled in the art and need not be explained in more detail herein.

Figure 7A:
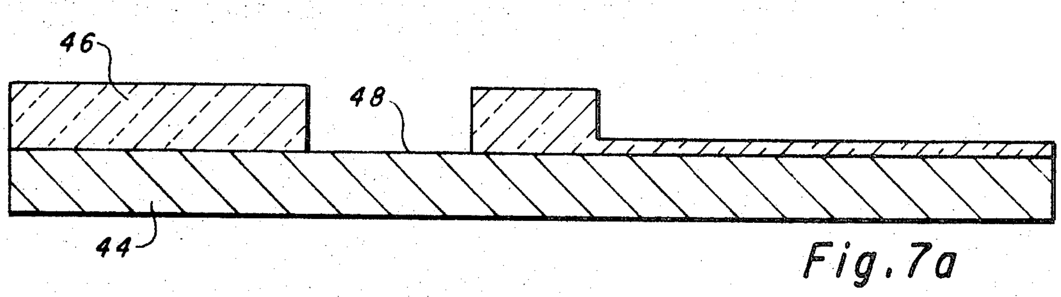
FIGS. 7–10 are sectional views along the line C–C′ of FIG. 6 illustrating various methods that may be utilized to fabricate a charge coupled device.
Figure 7B:
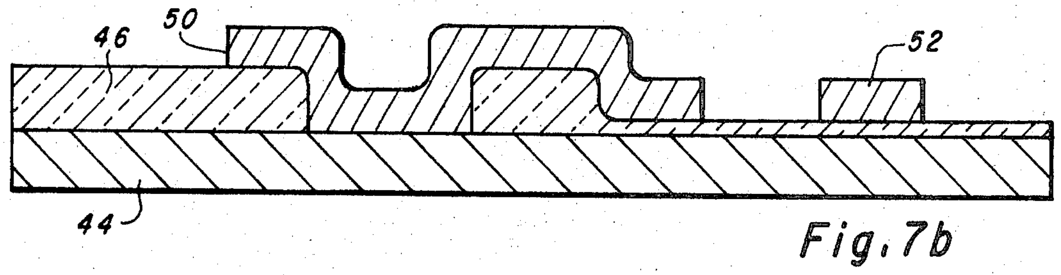
Figure 7C:
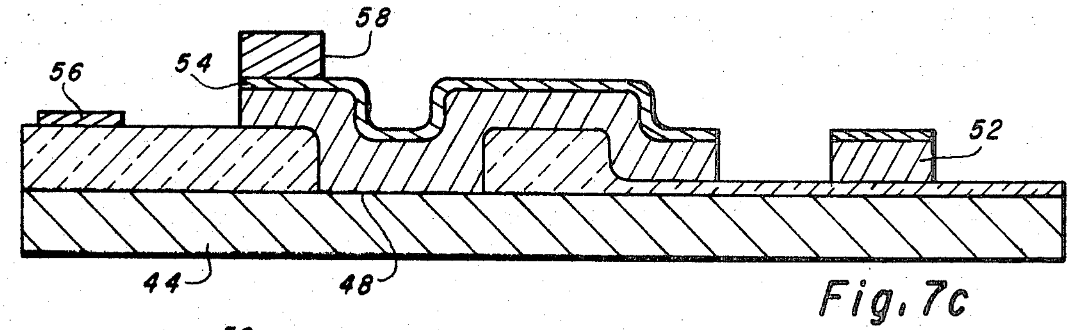
Figure 7D:
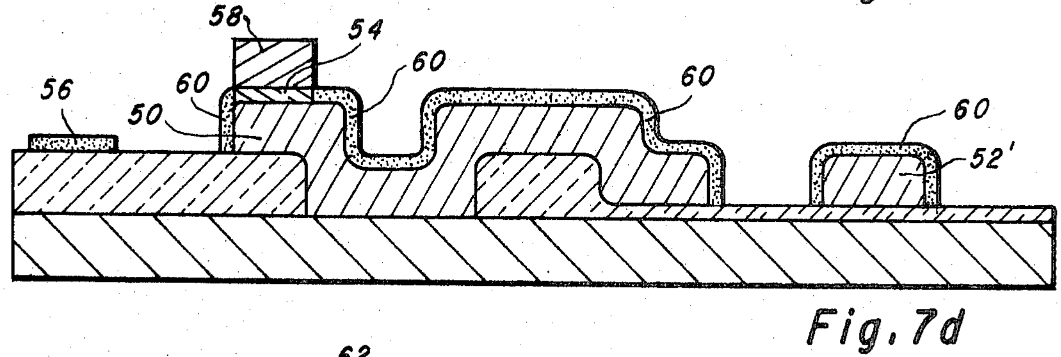
Figure 7E:
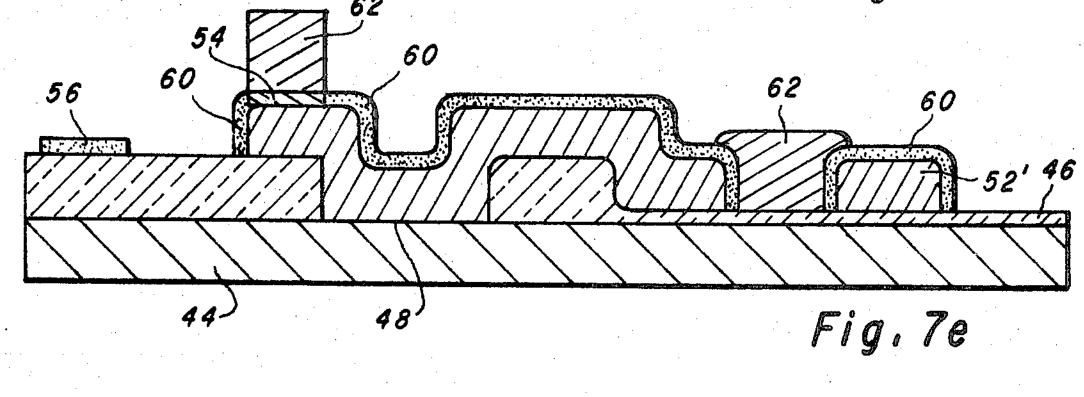

A first level of metal is deposited to overlie the surface of the oxide layer 46. This layer may, for example, be formed to a thickness of 10,000 angstroms. This first level of metal 50 is patterned using conventional masking and etching techniques to form the first level electrode such as electrodes 16 shown in FIG. 1. As shown with reference to FIG. 7*b*, the metal 50 fills the region 48 to make ohmic contact to the semiconductor material 44. The metal 50 is patterned to form an electrode 52. A relatively thin layer of aluminum 54 is evaporated to overlie the exposed insulating layer 46 and the first level of metal 50. This layer may, for example, be formed on the order of 2000 angstroms in thickness. The layer 54 of aluminum is then patterned again to define the desired first level metal electrodes and also define the bus bar 56, which may be similar, for example, to the bus bar 36 shown in FIG. 6. A layer of protective material 58, such as KMER, is then patterned to overlie the region of aluminum wherein it is desired to make ohmic contact thereto. For example, with reference to FIG. 7*c*, the layer 58 is formed to overlie the via hole 48 to the surface of the semiconductor material 44. It is understood, of course, that where contacts are desired to the first metallization layer electrodes 52 protective material 58 would be deposited thereover to form the holes as understood by those skilled in the art. A relatively thin layer of aluminum oxide is then formed by anodizing the aluminum. This is accomplished by applying a voltage potential to the bus bar 56 which is, as explained previously, connected to all of the electrodes 52. Anodixing current flows through the bus bar 56 and converts the external layer of the aluminum to aluminum oxide. In this process, the relatively thin layer of aluminum which forms the bus bar 56 is completely converted to aluminum oxide, thereby inherently stopping the anodizing process when the thickness of the bus bar 56 is completely anodized. The structure at this stage is shown in FIG. 7*d* with the anodized layer shown by the speckled area 60. As may be seen, the bus bar metallization 56 is completely converted to oxide. At this stage, it may be seen that all of the electrodes 52 are completely covered with a layer of insulating except of protected areas. The protective layer 58 is then removed and a second layer of aluminum 62 is then evaporated, to a thickness, e.g., of 5000 angstroms and patterned to form the second set of electrodes. As may be seen, an electrical path is provided through aluminum to the substrate surface 44 through the via hole 48. Similarly, conductive paths would be provided to electrodes 52 in regions where via holes similar to 48 had been formed. Obviously, the number and location of such via holes will vary with design requirements and it is not critical to the present invention. Further, the region of the second level metallization, shown generally at 62, which defines one of the second level metallization electrodes, is formed adjacent the first level metallization electrode 52 and is separated therefrom only by the thickness of the oxide layer 60. This results in several significant advantages. First, it provides a method for forming two adjacent electrodes, such as 62 and 52, which are spaced extremely close together, on the order of 3000 angstroms or less. Another advantage of the method of the present invention is that the contact regions of the adjacent electrodes 62 and 52 adjacent the insulating layer 46 are separated from the semiconductor material 44 by a uniform thickness; that is, the thickness of the insulating layer 46. This enables utilization of clock pulses having the same amplitude when such a structure is utilized as a charge coupled device.

Figure 8A:
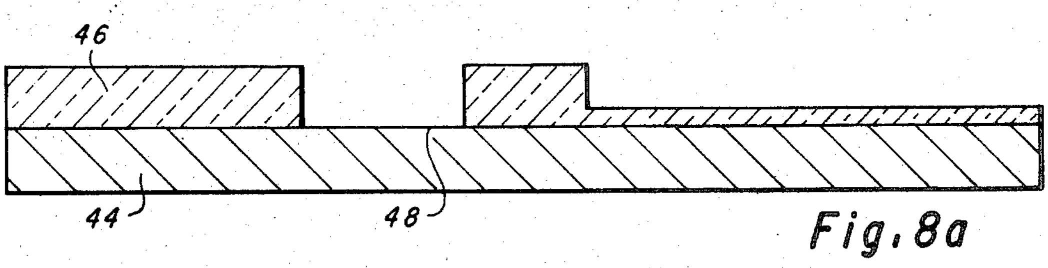
Figure 8B:
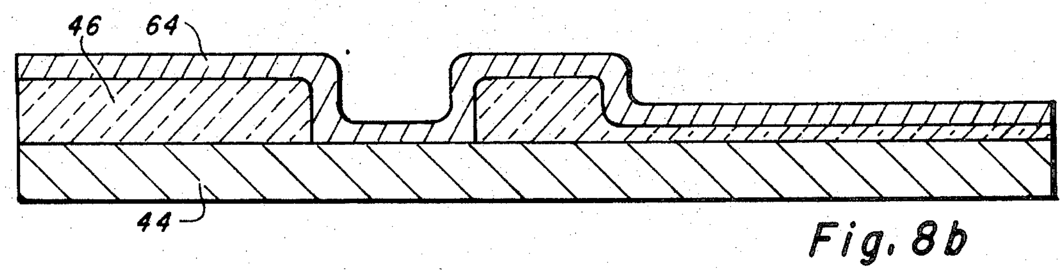
Figure 8C:
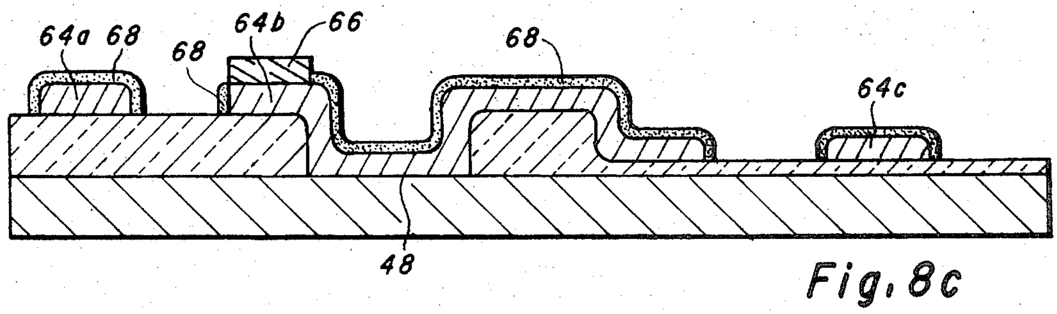
Figure 8D:
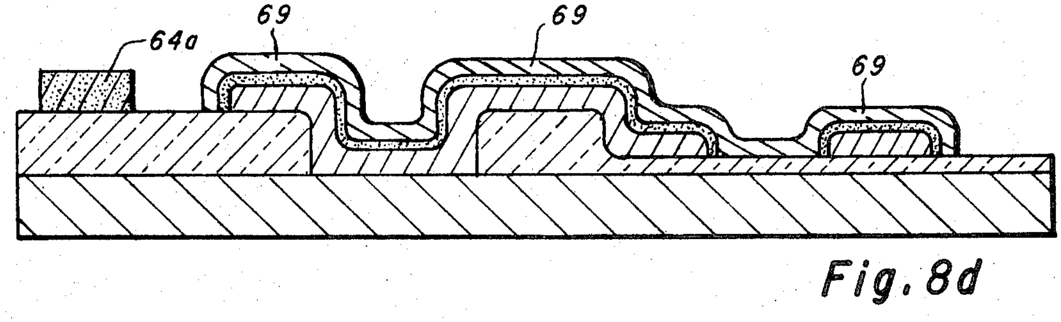
Figure 8E:
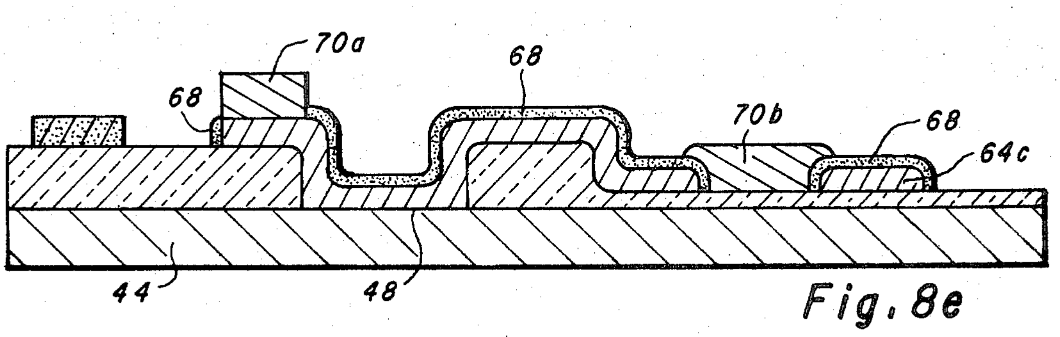

With reference now to FIGS. 8*a*–8*e*, a different method for forming closely spaced electrodes is described. Again, a silicon substrate is shown at 44 and an insulating layer 46 is formed to overlie the substrate. By way of example, a via hole 48, is illustrated for contact to the substrate material 44. A relatively thick layer of aluminum 64 is evaporated to overlie the insulating material 46 and to fill the via hole 48. The layer 64 may be formed, for example, to a thickness of 10,000 angstroms although this thickness is not critical. The layer 64 of aluminum is patterned to define a bus bar 64*a*, and a first level metallization electrode 64*c*. A layer of protective material. such as KMER, shown at 66, is formed to protect the contact to the via hole 48. As pointed out previously, the protective material would also be formed where via holes to first level metallization electrodes 64 are desired. An electric potential is applied to the bus bar 64*a*, and anodization effected as described in the aforementioned McMahon application so that a relatively thin layer of aluminum oxide is formed to overlie the aluminum 64. A layer of aluminum oxide 68 may be formed, for example, to a thicnkess on the order of 3000 angstroms. All of the first layer aluminum 64 is then covered with a protective layer 69, such as KMER, except the bus bar region 64*a*. The bus bar is then anodized to completion, completely converting it to aluminum oxide. The structure at this point in the process is shown in FIG. 8*d*. The protective layer 69 is then removed and a second layer of aluminum 70 is evaporated over this structure and patterned to defined the second layer of metallization electrodes. As may be seen with reference to FIG. 8*e*, the second level metallization makes contact to the surface of the substrate 44 in the region 70*a* through the via hole 48. In addition, the electrode region 70*b* is formed coplanar with the first level metallization electrode 64*c* and is separated therefrom only by the thickness of the oxide layer 68. This method has the advantage that only one metallization is required to define the first level electrodes.

Figures 9A, 9B, 9C, 9D, 9E, 9F:
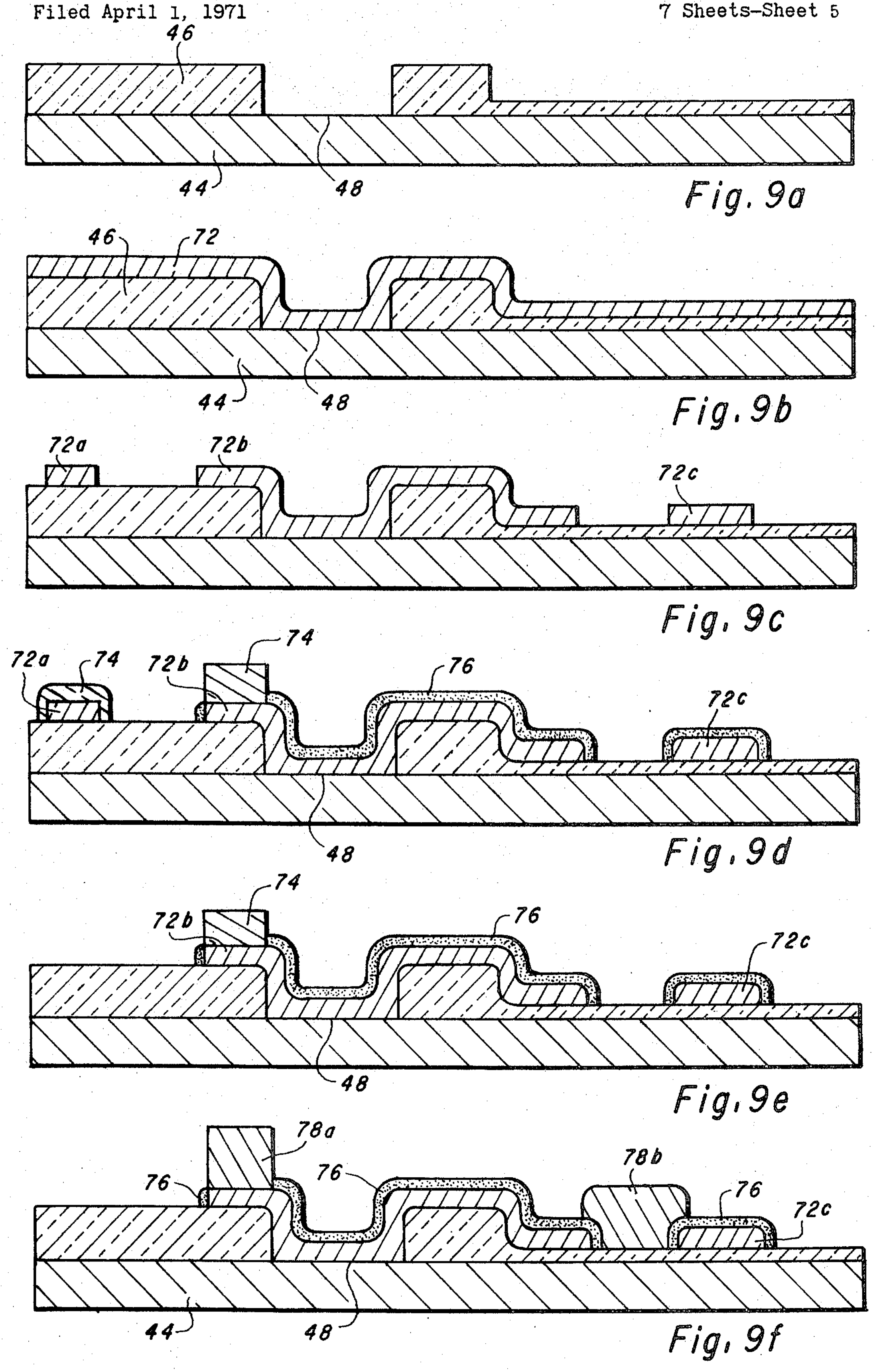
Figure 10A:
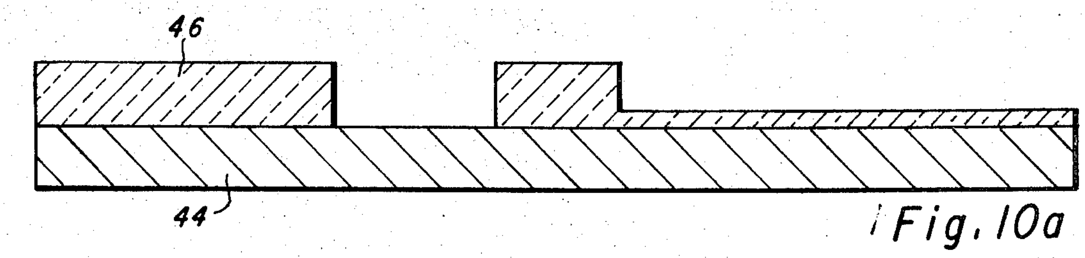
Figure 10B:
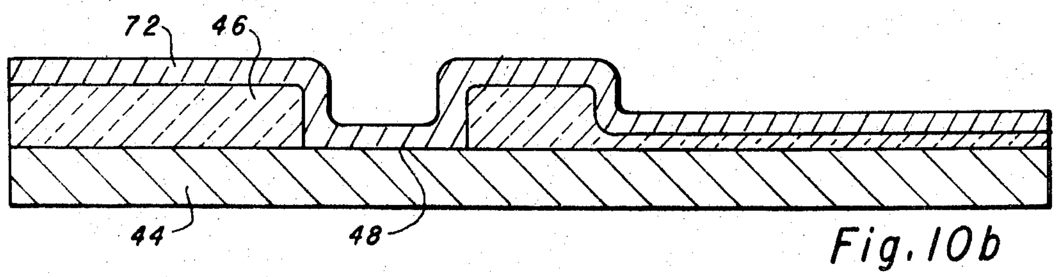
Figure 10C:
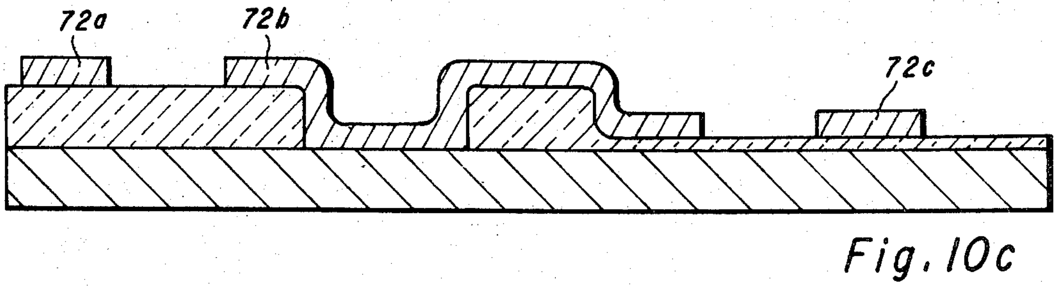
Figure 10D:
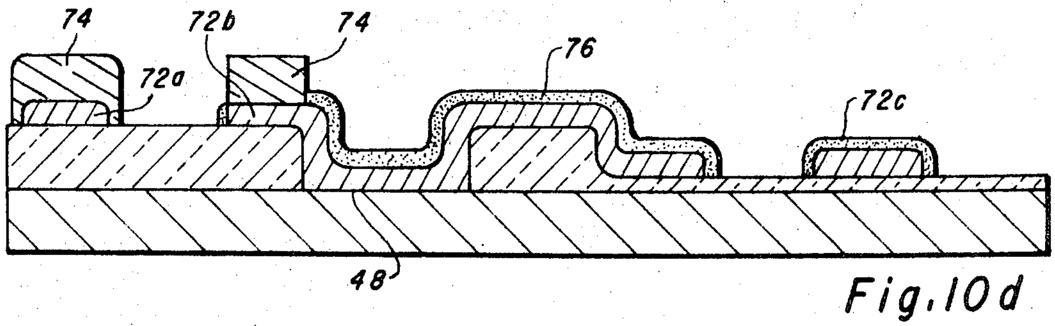
Figure 10E:
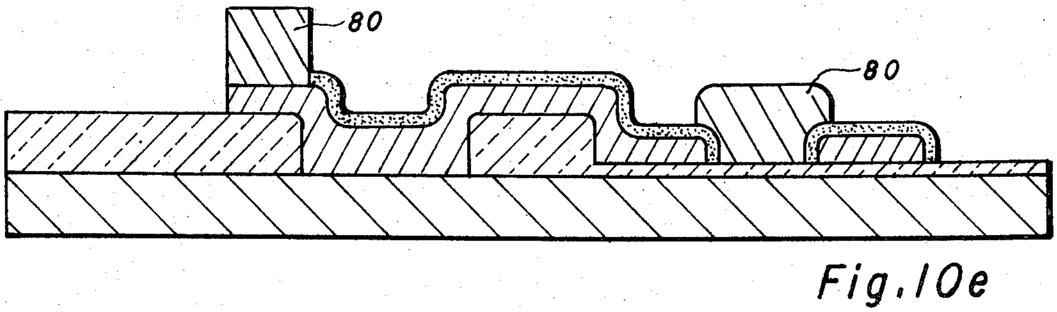

With reference now to FIG. 9, an additional method of the present invention will be described. A first layer of aluminum is deposited to overlie the insulating layer 46 and make contact to the semiconductor substrate 44 through a via hole shown generally at 48. The first level of aluminum 72, which may for example be formed to a thickness of 10,000 angstroms, is patterned to form a bus bar 72*a*, a contact region to the semiconductor material 44, shown generally at 72*b*, and a first level metallization electrode 72*c*. A protective layer 74, for example, of KMER is formed to overlie the bus bar 72*a* and the via hole contact region 48. A potential is then applied to the bus bar 72*a* to form a layer of anodized oxide over the exposed aluminum 72. The oxide layer is shown generally at 76. The KMER protective layer 74 overlying the bus bar region 72*a* is then removed and the bus bar 72*a* etched with a suitable etchant well known to those skilled in the art. The structure at this stage of the process is shown in FIG. 9*c*. The KMER protective layer 74 overlying the via holes is then removed and a second layer of aluminum 78 is evaporated to overlie the structure. This layer of aluminum is patterned and etched to define the second level electrodes. The second level aluminum makes contact at 78*a* through the via hole 48 to the semiconductor substrate material 44. A second level metallization electrode 78*b* is shown adjacent the first level metallization electrode 72*c* and is separated there from only by the oxide layer 76. This method has the advantage in that it is not necessary to anodize the bus bar to completion, but rather, suitable etchants are utilized to remove the aluminum bus bar.

With reference to FIG. 10, a modification of the process described with reference to FIG. 9 is depicted. Again, a first level of aluminum 72 which may, for example, be evaporated to a thickness of 5000 angstroms, although such a thickness is in no way critical, is shown at 72. This layer of aluminum is patterned to form a bus bar region 72*a*, contact to the semiconductor material 44 through a via hole 48, shown generally at 72*b* and a first level metallization electrode 72*c*. A protective layer, such as KMER, shown at 74 is formed to overlie the bus region 72*a* and the via hole region 72*b*. Anodization is then accomplished to form an oxide layer 76 over the remainder of the exposed first layer aluminum 72. The KMER is then removed from both the bus bar region 72*a* and the region 72*b* and a second layer of aluminum 80 is deposited to overlie the structure. The aluminum 80 is patterned to form the desired configuration of second layer metallization electrodes. In this patterning step, the unprotected bus bar is etched away along with the undesired second level metallization aluminum. This process has the advantage of requiring fewer steps since special steps are not required to remove the bus bar.

Figure 11:
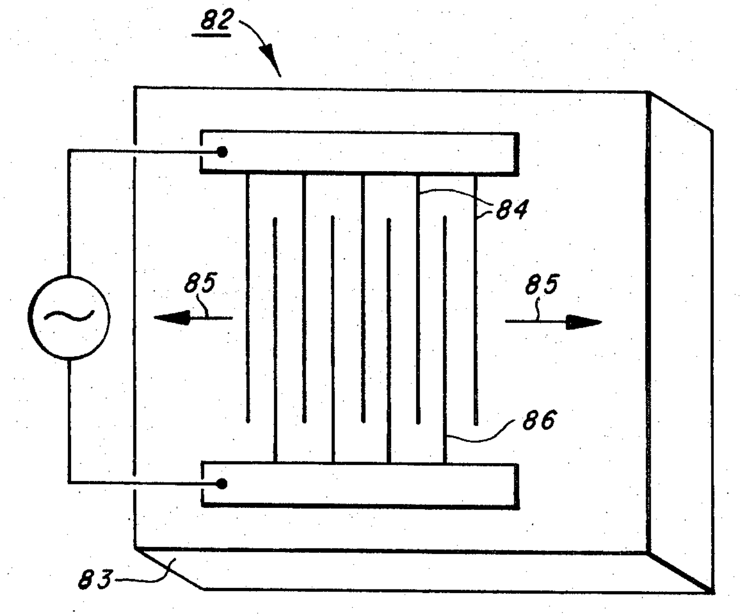
FIG. 11 is a plan view illustrating an interdigitated surface wave transducer structure.

With reference to FIG. 11, an interdigitated surface wave transistor is schematically illustrated at 82 and comprises a first array of electrodes 84 interleaved with a second array of electrodes 86. The center to center spacing of adjacent electrodes 84–86 defines the center frequency of operation of the transducer. To obtain high frequencies, the center to center spacing must be extremely small. As understood by those skilled in the art, the transducer is defined on the surface of a piezoelectric substrate 83 such as quartz, lithium niobate, etc. A signal applied to the transducer electrodes generates a surface wave, schematically illustrated by arrows 85, in the substrate surface. Various substrate materials, transducer geometries, etc. are well known and need not be illustrated and described herein. For example, reference copending application Ser. No. 69,081, Hartman et al., "Unidirectional Surface Wave Transducer," filed Sept. 2, 1970, and assigned to the same assignee as the present invention. The electrodes 84 and 86 may be formed, for example, in accordance with the methods of the present invention illustrated in FIGS. 6–10. In this case electrode set 84 would be fabricated as the first level of metal and electrode set 86 would consist of the second level of metallization.

As may be seen by reference to the aforementioned detailed description of the present invention, the stated objects of the present invention have advantageously been achieved. The present invention provides the advantage of separating adjacent electrodes by a thickness of only about 3000 angstroms. In addition, this provides the advantage of sealing the electrodes from ambient humidity which changes the device sensitivity. Further, it may be seen that the present invention provides the advantage of forming a multi-level metal system wherein all the metallization is of the same resistivity and wherein the separation between the various electrodes and the semiconductor material is uniform from electrode to electrode.

This latter provision provides the advantage of enabling clock pulses of the same amplitude to be utilized to control a charge coupled device. In addition, since the aluminum oxide layer formed to separate adjacent electrodes has a high dielectric constant, this enhances the coupling between electrodes and increases the charge transfer efficiency. Further, it may be seen that the aluminum oxide-silicon oxide interface advantageously provides a location for negative charge buildup in a charge coupled device which would invert a n-type surface and remove any potential barriers of silicon between electrodes thus enhancing the charge transfer efficiency.

While various embodiments of the present invention have been described herein, it will be apparent to a person skilled in the art that modifications to the details of construction may be effected without departing from the scope or spirit of the invention. For example, although four phase CCD construction has been illustrated, the anodization technique can equally be used to construct any multiphase system.

What is claimed is:

1. A method for forming adjacent, closely spaced, regions of metal coplanar with an insulating surface of a substrate comprising the steps of:

(a) forming a first layer of metal over an insulating surface;
(b) patterning said first layer of metal to define a first set of spaced apart metal regions, said patterning exposing regions of said insulating surface intermediate respective ones of said first set of metal regions;
(c) providing means for connecting said first set of metal regions to a voltage source;
(d) selectively anodizing a portion of each of said first set of metal regions to form an oxide layer over the exposed surface thereof;
(e) electrically insulating said first set of metal regions one from another;
(f) forming a second layer of metal over said anodized surface of said first set of metal regions and said exposed insulating surface therebetween; and
(g) patterning said second layer of metal to define a second set of spaced apart metal regions spaced intermediate respective ones of said first set of metal regions and spaced therefrom by the thickness of said anodized oxide layer.

2. A method for forming adjacent closely spaced electrodes coplanar with the surface of a substrate and electrically insulated from said substrate comprising the steps of:

(a) forming a first layer of metal over a substrate, the surface of which is electrically insulating;
(b) patterning said first layer of metals to define a first set of spaced apart electrodes;
(c) forming a bus bar to connect said first set of electrodes to a voltage source;
(d) selectively anodizing said first set of electrodes to form an oxide layer over the surface thereof, the anodization current through said bus bar completely converting said bus bar to an oxide;
(e) forming a second layer of metal over said anodized first set of electrodes and the surface of said substrate therebetween; and
(f) patterning said second layer of metal to define a second set of spaced apart electrodes, said second set of electrodes contacting the surface of said substrate in the same plane as the contact between said first set of electrodes and said substrate, said first and second sets of electrodes respectively being separated by the thickness of said anodized oxide layer.

3. The method for forming adjacent closely spaced electrodes as set forth in claim 2 wherein said substrate comprises a body of semiconductor material having an oxide layer formed on a surface thereof.

4. The method as set forth in claim 2 wherein said first and second metals comprise aluminum.

5. The method as set forth in claim 4 wherein said anodized oxide layer is formed to a thickness on the order of 3000 angstroms.

6. A method for forming adjacent closely spaced electrodes coplanar with the surface of a substrate and electrically insulated from said substrate comprising the steps of:

(a) forming a first layer of metal over a substrate, the surface of which is electrically insulating;
(b) patterning said first layer of metal to define a first plurality of spaced apart electrodes electrically interconnected by a bus bar;
(c) masking said bus bar;
(d) selectively anodizing said electrodes to form an oxide barrier over said first plurality of electrodes;
(e) masking and completely etching to remove said bus bar;
(f) forming and patterning a second layer of metal to define a second plurality of spaced apart electrodes, respective ones of which are intermediate and coplanar with respective pairs of said first plurality of electrodes and which are separated therefrom by said anodized oxide layer.

7. In a method for fabricating a charge coupled device having coplanar closely spaced electrodes, the steps of:

(a) depositing a first array of spaced apart metal electrodes;
(b) interconnecting said first array of electrodes with a bus bar;
(c) selectively anodizing said first array to form a relatively thin barrier oxide layer over said first array of electrodes;
(d) removing said bus bar; and
(e) depositing a second array of spaced apart metal electrodes coplanar with and intermediate respective ones of said first array of electrodes, adjacent electrodes of said first and second arrays of electrodes being separated by said relatively thin barrier oxide layer.

8. A method for fabricating a charge coupled device having coplanar closely spaced electrodes comprising the steps of:

(a) depositing and patterning a first layer of metal over an insulating surface of a semiconductor substrate to define a first array of spaced apart electrodes;
(b) depositing a relatively thin layer of metal over said first array of electrodes and exposed insulating surface regions;
(c) patterning said relatively thin layer of metal to define both said first array of electrodes and a bus bar electrically interconnecting respective electrodes of said first array;
(d) masking the patterned thin layer of metal to preserve a contact region to each of respective electrodes of said first array;
(e) selectively anodizing said thin layer of metal to provide an oxide layer over the unmasked regions of said first array of electrodes, the anodizing current through said relatively thin bus bar completely converting said bus bar to oxide;
(f) removing said mask;
(g) depositing and patterning a second layer of metal to define a second array of spaced apart electrodes having a contact region to said insulating surface, said substrate surface coplanar with contact regions between said first array of electrodes and said insulating coating, respective electrodes of said first array being separated from electrodes of said second array by the thickness of said anodized barrier oxide layer; and
(h) providing contact means to said semiconductor substrate to enter and extract electrical charges;

whereby a sequence of electrical charges corresponding to data may be inserted through said contact means, propagated along said substrate by suitable pulses sequentially applied to said first and second array of electrodes, and subsequently detected by said contact means thereby effecting data operations.

9. A method for fabricating a charge coupled device having coplanar closely spaced electrodes comprising the steps of:

(a) depositing and patterning a first layer of metal over an insulating surface of a semiconductor substrate to define both a first array of spaced apart electrodes and a bus bar that electrically interconnects respective electrodes of said first array;

(b) masking selected areas of said first layer of metal;

(c) selectively anodizing said first layer of metal to provide a barrier oxide layer over the unmasked surface of said first layer of metal;

(d) masking said first array of electrodes;

(e) anodizing said bus bar to completely convert it to an oxide;

(f) removing said mask;

(g) depositing and patterning a second layer of metal to define a second array of spaced apart electrodes having a contact region to said insulating surface of said substrate coplanar with contact regions between said first array of electrodes and said insulating coating, respective electrodes of said first array being separated from electrodes of said second array by the thickness of said anodized barrier oxide layer; and (h) providing contact means to said semiconductor substrate to enter and extract electrical charges;

whereby a sequence of electrical charges corresponding to data may be inserted through said contact means, propagated along said substrate by suitable pulses sequentially applied to said first and second array of electrodes, and subsequently detected by said contact means thereby effecting data operations.

10. A method for fabricating a charge coupled device having coplanar closely spaced electrodes comprising the steps of:

(a) depositing and patterning a first layer of metal over an insulating surface of a semiconductor substrate to define both a first array of spaced apart electrodes and a bus bar that electrically interconnects respective electrodes of said first array;

(b) masking said bus bar and selected areas of said first array of electrodes;

(c) selectively anodizing said bus bar and said first array to provide a layer of oxide over the unmasked surface of said first array of electrodes;

(d) removing said mask over said bus bar and etching to completely remove said bus bar;

(e) depositing and patterning a second layer of metal to define a second array of spaced apart electrodes having a contact region to said insulating surface coplanar with contact regions between said first array of electrodes and said insulating surface, respective electrodes of said first array being separated from electrodes of said second array by the thickness of said anodized barrier oxide layer; and (f) providing contact means to said semiconductor substrate to enter and extract electrical charges;

whereby a sequence of electrical charges corresponding to data may be inserted through said contact means, propagated along said substrate by suitable pulses sequentially applied to said first and second array of electrodes, and subsequently detected by said contact means thereby effecting data operations.

11. A method for fabricating a charge coupled device having coplanar closely spaced electrodes comprising the steps of:

(a) depositing and patterning a first layer of metal over an insulating surface of a semiconductor substrate to define a first array of spaced apart electrodes and a bus bar that electrically interconnects respective electrodes of said first array;

(b) masking said bus bar and selected areas of said first array of electrodes;

(c) selectively anodizing said bus bar and said first array to provide a layer of oxide over the unmasked surface of said first level of metal;

(d) removing said mask;

(e) depositing a second layer of metal and patterning said second layer of metal to define a second array of spaced apart electrodes having a contact region to said insulating surface coplanar with contact regions between said first array of electrodes and said insulating surface, respective electrodes of said first array being separated from electrodes of said second array by the thickness of said anodized barrier oxide layer, said bus bar being completely, etched away and thereby removed during said patterning step; and (f) providing contact means to said semiconductor substrate to enter and extract electrical charges;

whereby a sequence of electrical charges corresponding to data may be inserted through said contact means. propagated along said substrate by suitable pulses sequentially applied to said first and second array of electrodes and subsequently detected by said contact means thereby effecting data operation.

References Cited

UNITED STATES PATENTS

| | | | |
|---|---|---|---|
| 3,663,279 | 5/1972 | Lepselter | 204—56 |
| 3,665,346 | 5/1972 | Orr | 204—15 |

JOHN H. MACK, Primary Examiner

R. L. ANDREWS, Assistant Examiner

U.S. Cl. X.R.

204—38 A, 56 R, 58